(12) United States Patent
Heinrich et al.

(10) Patent No.: US 8,492,269 B2
(45) Date of Patent: Jul. 23, 2013

(54) HYBRID CONTACT STRUCTURE WITH LOW ASPECT RATIO CONTACTS IN A SEMICONDUCTOR DEVICE

(75) Inventors: Jens Heinrich, Wachau (DE); Ralf Richter, Dresden (DE); Torsten Huisinga, Dresden (DE); Kai Frohberg, Niederau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/234,529

(22) Filed: Sep. 16, 2011

(65) Prior Publication Data

US 2012/0181692 A1 Jul. 19, 2012

(30) Foreign Application Priority Data

Jan. 17, 2011 (DE) .................. 10 2011 002 769

(51) Int. Cl.
*H01L 21/4763* (2006.01)
(52) U.S. Cl.
USPC ........... 438/627; 438/629; 438/637; 438/638; 257/E21.575; 257/E21.577
(58) Field of Classification Search
USPC .. 438/197, 629, 627, 637, 638; 257/E21.575, 257/E21.577
See application file for complete search history.

(56) References Cited

U.S. PATENT DOCUMENTS

| 5,897,369 | A  | * | 4/1999 | Jun ............................. | 438/629 |
| 6,958,540 | B2 | * | 10/2005 | Gambino et al. ............. | 257/750 |
| 7,084,027 | B2 |   | 8/2006 | Hilliger et al. ............... | 438/239 |
| 7,514,354 | B2 | * | 4/2009 | Park et al. ..................... | 438/629 |
| 7,737,026 | B2 | * | 6/2010 | Li et al. ......................... | 438/637 |
| 2006/0046456 | A1 | * | 3/2006 | An .................................. | 438/597 |
| 2006/0188659 | A1 | * | 8/2006 | Chen et al. .................... | 427/437 |
| 2007/0164442 | A1 | * | 7/2007 | McTeer .......................... | 257/762 |
| 2008/0217775 | A1 | * | 9/2008 | Pai et al. ........................ | 257/751 |
| 2008/0230919 | A1 | * | 9/2008 | Tseng et al. ................... | 257/774 |
| 2010/0087064 | A1 |   | 4/2010 | Fujii et al. ..................... | 438/680 |

FOREIGN PATENT DOCUMENTS

DE  100 55 290 C1  11/2000

OTHER PUBLICATIONS

Translation of Official Communication from German Patent Office for German Patent Application No. 10 2011 002 769.6 dated Aug. 19, 2011.

* cited by examiner

*Primary Examiner* — Michael Trinh
(74) *Attorney, Agent, or Firm* — Williams, Morgan & Amerson, P.C.

(57) ABSTRACT

In sophisticated semiconductor devices, superior contact resistivity may be accomplished for a given contact configuration by providing hybrid contact elements, at least a portion of which may be comprised of a highly conductive material, such as copper. To this end, a well-established contact material, such as tungsten, may be used as buffer material in order to preserve integrity of sensitive device areas upon depositing the highly conductive metal.

15 Claims, 8 Drawing Sheets

HYBRID CONTACT STRUCTURE WITH LOW ASPECT RATIO CONTACTS IN A SEMICONDUCTOR DEVICE

BACKGROUND OF THE INVENTION

1. Field of the Invention

The present disclosure generally relates to the field of semiconductor manufacturing, and, more particularly, to the formation of an interconnect structure directly contacting a circuit element with the first metallization level.

2. Description of the Related Art

Semiconductor devices, such as advanced integrated circuits, typically contain a great number of circuit elements, such as transistors, capacitors, resistors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured, but require one or more additional wiring layers, which are also referred to as metallization layers. These metallization layers generally include metal-containing lines, providing the inner-level electrical connection, and also include a plurality of inter-level connections, which are also referred to as vias, that are filled with an appropriate metal and provide the electrical connection between two neighboring stacked metallization layers.

Due to the continuous reduction of the feature sizes of circuit elements in modern integrated circuits, the number of circuit elements for a given chip area, that is, the packing density, also increases, thereby requiring an even larger increase in the number of electrical connections to provide the desired circuit functionality, since the number of mutual connections between the circuit elements typically increases in an over-proportional way compared to the number of circuit elements. Therefore, the number of stacked metallization layers usually increases as the number of circuit elements per chip area becomes larger, while nevertheless the sizes of individual metal lines and vias are reduced. Due to the moderately high current densities that may be encountered during the operation of advanced integrated circuits, and owing to the reduced feature size of metal lines and vias, semiconductor manufacturers are increasingly replacing the well-known metallization materials, such as aluminum, by a metal that allows higher current densities and, hence, permits a reduction in the dimensions of the interconnections. Consequently, copper and alloys thereof are materials that are increasingly used in the fabrication of metallization layers due to the superior characteristics in view of resistance against electromigration and the significantly lower electrical resistivity compared to, for instance, aluminum. Despite these advantages, copper also exhibits a number of disadvantages regarding the processing and handling of copper in a semiconductor facility. For instance, copper readily diffuses in a plurality of well-established dielectric materials, such as silicon dioxide, wherein even minute amounts of copper, accumulating at sensitive device regions, such as contact regions of transistor elements, may lead to a failure of the respective device. For this reason, great efforts have to be made so as to reduce or avoid any copper contamination during the fabrication of the transistor elements, thereby rendering copper a less attractive candidate for the formation of contact plugs, which are in direct contact with respective contact regions of the circuit elements. The contact plugs provide the electrical contact of the individual circuit elements to the first metallization layer, which is formed above an inter-layer dielectric material that encloses and passivates the circuit elements.

Consequently, in advanced semiconductor devices, the respective contact plugs are typically formed of a tungsten-based metal in an interlayer dielectric stack, typically comprised of silicon dioxide that is formed above a corresponding bottom etch stop layer, which may typically be formed of silicon nitride. Due to the ongoing shrinkage of feature sizes, however, the respective contact plugs have to be formed within respective contact openings with an aspect ratio which may be as high as approximately 8:1 or more, wherein a diameter of the respective contact openings may be 0.1 µm or even less for transistor devices of the 65 nm technology. The aspect ratio of such openings is generally defined as the ratio of the depth of the opening to the width of the opening. Consequently, the resistance of the respective contact plugs may significantly restrict the overall operating speed of highly advanced integrated circuits, even though a highly conductive material, such as copper or copper alloys, may be used in the metallization layers. Moreover, sophisticated etch and deposition techniques may be required for forming the contact plugs, as will be described with reference to FIGS. 1a-1c in more detail.

FIG. 1a schematically illustrates a top view of a portion of a semiconductor device 100. The semiconductor device 100 comprises a substrate (not shown in FIG. 1a), above which is formed a semiconductor layer (not shown), in and above which circuit elements, such as a transistor and the like, are formed. For convenience, a circuit element in the form of a transistor 150 is illustrated. The transistor 150 may comprise a gate electrode structure 151, sidewalls of which may be covered by a spacer element 152. Laterally adjacent to the gate electrode structure 151, an active region in the form of drain and source regions 153 are provided which may be, in addition to a channel region (not shown), located below the gate electrode structure 151 and may represent an active region in the corresponding semiconductor layer. The active region may be defined by an isolation structure 102, above which also a portion of the gate electrode structure 151 may be positioned, thereby defining a contact region 154 in contact with a contact plug or contact element 110. Similarly, one or more contact elements 111 may be provided in the drain or source regions 153, wherein, for convenience, only one such contact element 111 is illustrated. It should be appreciated that the contact elements 110, 111 are typically formed in an appropriate interlayer dielectric material which, for convenience, is not shown in FIG. 1a.

FIG. 1b schematically illustrates a cross-sectional view along the line Ib as shown in FIG. 1a, wherein the semiconductor device 100 is illustrated in a further advanced manufacturing stage. As shown, the semiconductor device 100 comprises a substrate 101 which represents any appropriate carrier material, such as a silicon substrate, a silicon-on-insulator (SOI) substrate and the like. A silicon-based semiconductor layer 103 is formed above the substrate 101, and the isolation structure 102, for instance in the form of a trench isolation, defines an active region 104 in which are positioned the drain and source regions 153, i.e., respective dopant concentrations, so as to define respective PN junctions with the remaining portion of the active region 104. Furthermore, metal silicide regions 155 may be formed in the drain and source regions 153, thereby defining a contact region thereof, and on the gate electrode structure 151, including the contact portion 154, thereby also defining a respective contact region for the gate electrode structure 151. Furthermore, the semiconductor device comprises an interlayer dielectric material 115 which typically comprises two or more dielectric layers, such as the layer 115A, which may represent a contact etch stop layer comprised of silicon nitride, and a second dielectric material 115B, for instance provided in the form of a silicon dioxide material. Typically, a thickness 115T of the interlayer dielectric material 115 is in the range of several hundred nanometers so as to obtain a sufficient distance between the gate electrode structure 151 and a first metallization layer 120 in order to maintain the parasitic capacitance at a required low level. Consequently, the contact element 111 connecting to the drain or source region 153 may have a moderately high aspect ratio, since the lateral size thereof is substantially restricted by the lateral dimension of the drain and source regions 153, while the depth of the contact element 111 is determined by the thickness 115T of the interlayer dielectric material 115. On the other hand, the contact element 110 only has to extend down to the top surface of the gate electrode structure 151, i.e., to the contact portion 154, while also the lateral dimension of the contact element 110 may be different compared to the element 111, depending on the size and shape of the contact portion 154. The contact elements 110, 111 typically comprise a barrier material in the form of a titanium liner 112, followed by a titanium nitride liner 113, while the actual fill material 114 may be provided in the form of a tungsten material.

The metallization layer 120 typically comprises an etch stop layer 123, for instance in the form of silicon nitride, silicon carbide, nitrogen-enriched silicon carbide and the like, on which may be formed an appropriate dielectric material 124, such as a low-k dielectric material having a relative permittivity of 3.0 or less. Moreover, respective metal lines 121, 122 are formed in the dielectric material 124 and connect to the contact elements 110, 111, respectively. The metal lines 121, 122 may comprise a copper-containing metal, in combination with an appropriate barrier material 125, such as a material comprising tantalum, tantalum nitride and the like. Finally, a cap layer 126 is typically provided so as to confine the copper material in the metal lines 121, 122, which may be accomplished on the basis of dielectric materials such as silicon nitride, silicon carbide and the like.

A typical process flow for forming the semiconductor device 100 as shown in FIG. 1b may comprise the following processes. After forming the circuit element 150 on the basis of well-established techniques in accordance with design rules of the respective technology node, which includes forming an appropriate gate insulation layer (not shown) and patterning the same along with the gate electrode structure 151 by sophisticated lithography and etch techniques, the drain and source regions 153 may be formed by ion implantation, using the spacer structure 152 as an appropriate implantation mask. After any anneal cycles, the metal silicide regions 155 are formed and the interlayer dielectric material 115 is deposited, for instance by forming the contact etch stop layer 115A, followed by the deposition of silicon dioxide material 115B on the basis of plasma enhanced chemical vapor deposition (CVD) techniques. After planarizing the resulting surface topography of the silicon dioxide material 115B, a photolithography sequence may be performed on the basis of well-established recipes, followed by anisotropic etch techniques for forming contact openings extending through the interlayer dielectric material 115 so as to connect to the gate electrode structure 151 and the drain and source regions 153. During the respective etch process, sophisticated patterning regimes may be required due to the high aspect ratio of the corresponding contact opening, in particular for the contact element 111. During the complex etch sequence, the layer 115A may be used as an etch stop layer for etching the silicon dioxide material 115B, after which a further etch process may be performed in order to finally expose the contact regions in the drain and source regions 153 and the gate electrode structure 151, i.e., the metal silicide regions 155. Next, the titanium nitride liner 112 is formed on the basis of, for instance, physical vapor deposition, such as sputter deposition. The term sputtering describes a mechanism in which atoms are ejected from a surface of a target material that is itself hit by sufficiently energetic particles. Sputtering has become a frequently used technique for depositing titanium, titanium nitride and the like. Due to the superior characteristics compared to, for instance, CVD techniques with respect to controlling layer thickness, forming compounds such as titanium nitride and the like, additionally, exposed surfaces may inherently be cleaned by performing a sputtering without providing a deposition species. Thus, after forming the titanium nitride liner 112, the titanium layer 113 may also be formed by sputter deposition, wherein, however, the high aspect ratio, in particular in the contact opening corresponding to the contact element 111, may result in an increased layer thickness at sidewall portions so as to accomplish a reliable coverage of all exposed surface portions of the contact opening. Thereafter, the tungsten material 114 may be deposited by CVD in which tungsten hexafluorine ($WF_6$) is reduced in a thermally activated first step on the basis of silane and is then converted into tungsten in a second step on the basis of hydrogen. During the reduction of the tungsten on the basis of hydrogen, a direct contact to silicon dioxide of the layer 115B is substantially prevented by the titanium liner 113 in order to avoid undue silicon consumption from the silicon dioxide. On the other hand, the titanium nitride layer 112 may enhance the adhesion of the titanium liner 113, thereby enhancing the overall mechanical stability of the contact elements 110, 111. Thus, the increased aspect ratio of the contact element 111 may result in a highly complex etch sequence and a subsequent deposition of the liners 112, 113 which may result in a reduced effective cross-sectional area of the contact element 111, thereby increasing the overall series resistance thereof. On the other hand, any non-uniformities during the complex patterning process may result in a contact failure, which may represent one of the dominant factors that contribute to the overall yield loss.

Thereafter, the metallization layer 120 may be formed by depositing the etch stop layer 123 followed by the deposition of the dielectric material 124. Next, respective trenches are formed in the dielectric material 124 according to well-established single damascene strategies. Next, metal lines 121, 122 may be formed by depositing a barrier layer 125 and filling in a copper-based material, for instance on the basis of electroplating, which may be preceded by the deposition of a copper seed layer. Finally, any excess material may be removed, for instance, by chemical mechanical planarization (CMP), and the cap layer 126 may be deposited.

Consequently, the contact structure of the semiconductor device 100 comprises high aspect ratio contacts, such as the contact element 111, which may exhibit an increased contact resistivity in highly scaled semiconductor devices.

FIG. 1c schematically illustrates a cross-sectional view in which the semiconductor device 100 may comprise a plurality of closely spaced transistors 150A, 150B, 150C, each of which may comprise a corresponding gate electrode structure 151, as is for instance also described above with reference to FIGS. 1a and 1b. The transistors 150A, 150B, 150C may have contact by means of the contact elements 111, wherein, in sophisticated applications, the lateral dimension 111W of these contact elements is comparable to the space between the closely spaced gate electrode structures 151. In this case, the conductivity of the contact elements 111 may be further reduced since, for instance, for a given contact technology, i.e., providing tungsten in combination with appropriate barrier materials, as described above, the thickness of these barrier materials may not be arbitrarily reduced unless significant irregularities may be encountered during the complex patterning process, as is, for instance, described above with reference to FIGS. 1a and 1b. On the other hand, the height or thickness 115T of the dielectric material or material system 115 cannot be reduced without significantly affecting the parasitic capacitance with respect to the metallization layer to be formed above the contact elements 111, as is also previously described. For these reasons, it has been proposed to replace the conductive material of the contact elements 111 with a metal of superior conductivity, such as copper, as is typically used in the metallization system of the device 100. Since copper has to be reliably confined by an appropriate barrier material or material system, as is also described above with respect to the metal lines 121, 122, connecting copper-based contact elements 111 with critical contact regions, such as the contact regions 155, may involve a significant risk of incorporating copper in critical device areas. For example, in particular, the contact regions 155 within the semiconductor layer 103 may have a reduced thickness, which in turn may result in undue exposure of any semiconductor areas, for instance upon depositing barrier materials, for instance on the basis of a pre-deposition sputter clean process and the like. Consequently, providing the contact elements 111 as copper contact elements may result in significant yield losses due to the incorporation of copper in sensitive device areas.

In view of the situation described above, the present disclosure relates to manufacturing techniques and semiconductor devices in which conductivity of contact elements may be enhanced for a given device configuration, while avoiding, or at least reducing, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which a hybrid contact element may be provided in order to significantly increase the overall conductivity of the contact elements for a given device geometry, while at the same time a significant portion of the contact element may comprise a conductive material of superior conductivity, thereby also increasing the overall conductivity of the contact elements. To this end, any appropriate and well-established contact regime may be applied for a lower part of the contact elements in order to form a solid and robust contact portion, which may then be contacted by any appropriate material system, such as a copper-containing material, a silver-containing material and the like. In some illustrative embodiments disclosed herein, appropriate and robust contact regimes may be applied, followed by the removal of a portion of the contact elements, which may then be replaced by a desired highly conductive material in order to significantly reduce the overall contact resistance.

One illustrative method disclosed herein comprises forming a dielectric layer above a circuit element having a contact region that is formed in a semiconductor region. The method further comprises forming a contact element in the dielectric layer so as to connect to the contact region, wherein the contact element comprises a first conductive material. Additionally, the method comprises forming a recess in the contact element by removing a portion of the first conductive material. Moreover, the recess is filled with a second conductive material that differs from the first conductive material.

A further illustrative method disclosed herein relates to forming a semiconductor device. The method comprises forming a dielectric layer above a circuit element that has a contact region. Furthermore, a vertical opening is formed in the dielectric layer so as to expose the contact region. The method further comprises forming a first conductive material in the vertical opening so as to extend to a first height level that is less than a height level of a surface of the dielectric layer. Moreover, the method comprises filling a second conductive material into the vertical opening, wherein a conductivity of the second conductive material is higher than a conductivity of the first conductive material.

One illustrative semiconductor device disclosed herein comprises a first contact region formed so as to directly connect to a semiconductor region. Moreover, a dielectric material layer is formed above the semiconductor region and extends therefrom to a surface height level. Furthermore, the semiconductor device comprises a vertical contact element formed in the dielectric material layer so as to directly connect to the contact region. A vertical contact element comprises a first portion that includes a first conductive material and that extends from the contact region to a first height level that is less or below the surface height level. Furthermore, the vertical contact element comprises a second portion that contains a second conductive material and that extends from the first height level to at least the surface height level, wherein the first conductive material has a conductivity that is less than a conductivity of the second conductive material.

BRIEF DESCRIPTION OF THE DRAWINGS

The disclosure may be understood by reference to the following description taken in conjunction with the accompanying drawings, in which like reference numerals identify like elements, and in which.

Figure 1A:
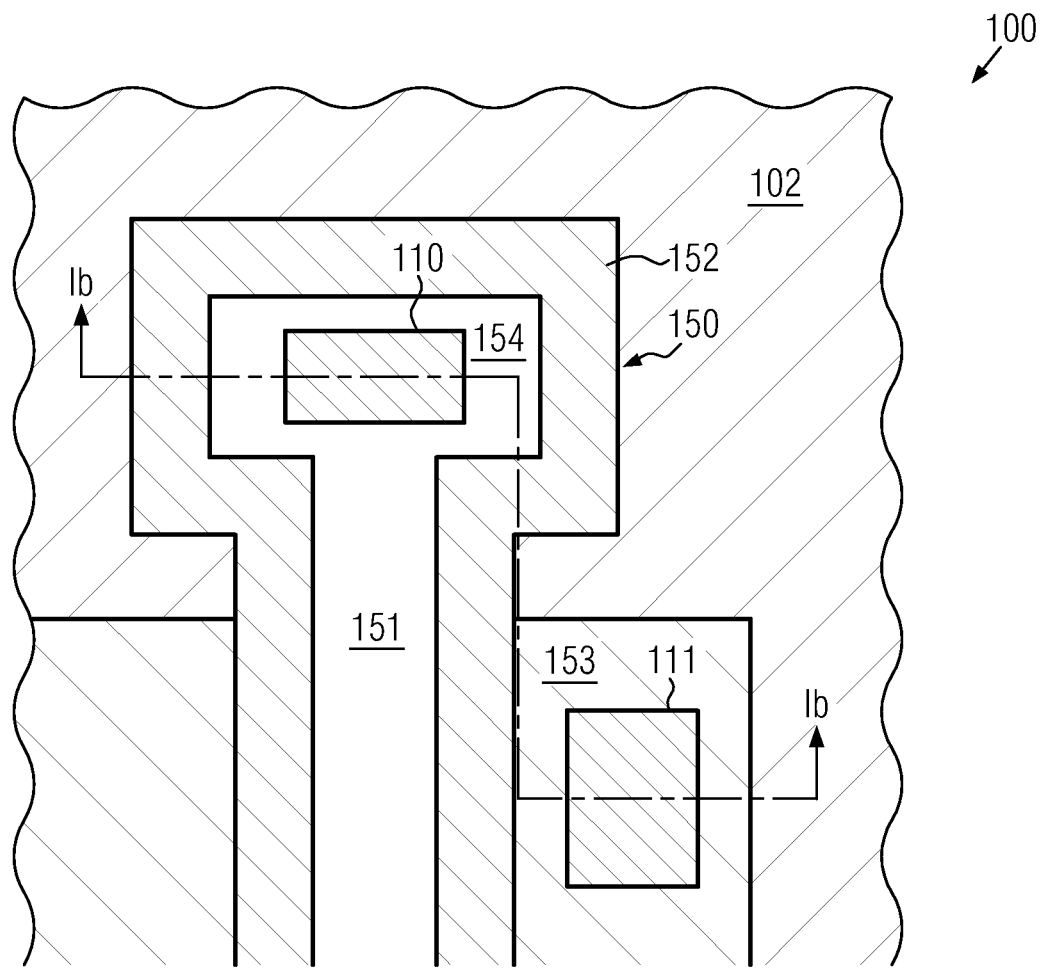
FIG. 1a schematically illustrates a top view of a semiconductor device comprising contact elements that connect to a gate electrode structure and to drain or source regions, according to conventional techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which superior conductivity of vertical contacts, which provide a connection between metal lines of the very first metallization layer and contact regions, such as gate electrode structures, drain and source regions and the like, wherein superior conductivity may be achieved by partially using a material of superior conductivity in the vertical contact elements. In illustrative embodiments disclosed herein, this hybrid contact configuration may be obtained by first forming a contact element on the basis of any appropriate contact technology, wherein at least a corresponding contact opening may be formed with its full height, followed by at least a partial filling of the contact opening with an appropriate material, such as tungsten, possibly in combination with any required barrier materials, cobalt and the like, which may thus provide robust interface characteristics with respect to a further contact material, which may provide superior overall conductivity of the resulting contact elements. For example, even very critical metals, such as copper, copper alloys and the like, silver and the like, may be efficiently used since any efficient process strategies may be applied for forming a highly conductive material in the remaining portion of the contact openings since the previously provided contact material may avoid process-related irregularities and may also act as a reliable interface between the semiconductor level and any wiring levels in which critical metals, such as copper, are used.

In some illustrative embodiments disclosed herein, well-established contact regimes based on tungsten may be applied, while, in other cases, superior deposition techniques, for instance on the basis of electrochemical deposition processes, may be applied, wherein any appropriate metal may be provided that may be deposited on the basis of these techniques. In some cases, even materials of reduced conductivity may be used, possibly without any barrier materials, such as cobalt and the like, wherein, in total, nevertheless, an increased overall conductivity may be achieved, since high resistance barrier materials may be omitted upon depositing a cobalt material directly on the contact region, while the remaining contact element may be provided on the basis of a highly conductive material, such as copper, silver and the like.

The first conductive material of the contact elements may, in some approaches, be applied so as to completely fill the contact opening and any excess portion of the material may be removed from the contact opening on the basis of any well-established etch techniques, while, in other cases, for instance by using wet chemical deposition techniques, the first conductive material may be filled into the opening with a desired fill height, followed by the deposition of the highly conductive material. In some illustrative embodiments disclosed herein, the vertical hybrid contact elements may be formed on the basis of a process strategy in which the metal lines of the first metallization layer may be provided in a dual damascene sequence, thereby providing superior process efficiency.

Figure 1B:
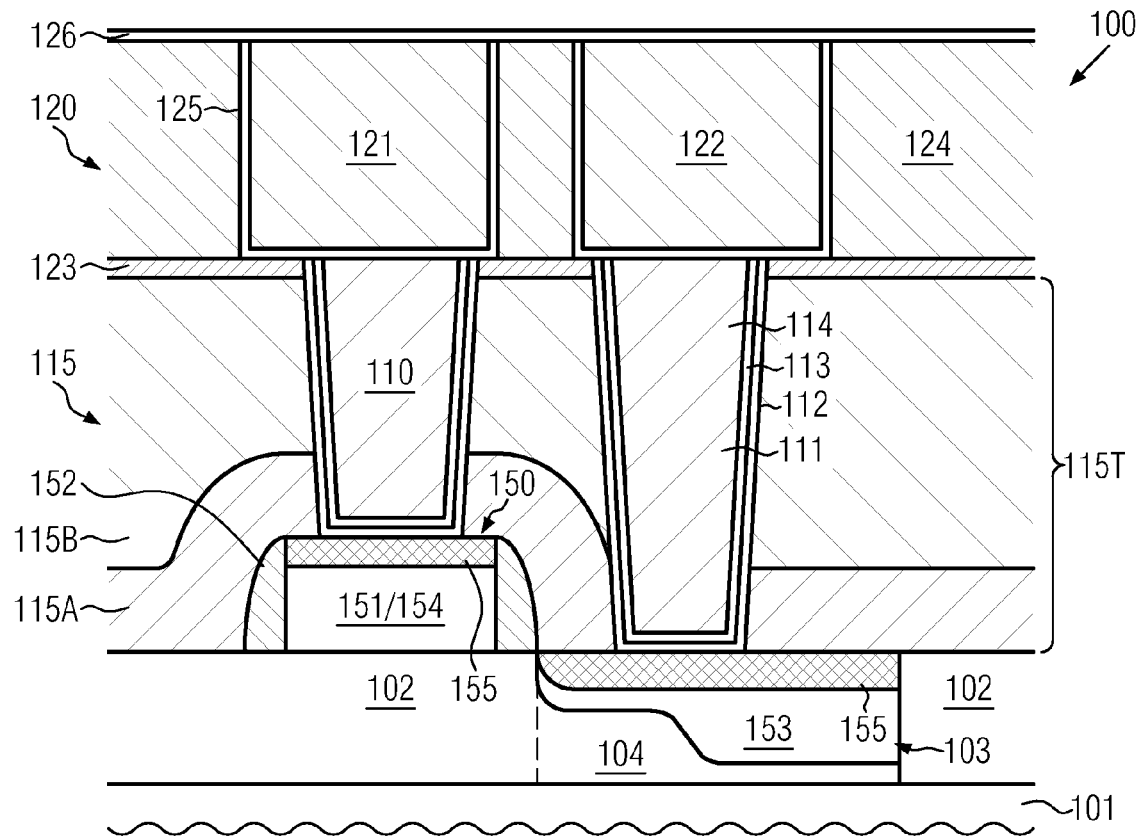
FIG. 1b schematically illustrates a cross-sectional view along the line Ib of FIG. 1a in a further advanced manufacturing stage.
Figure 1C:
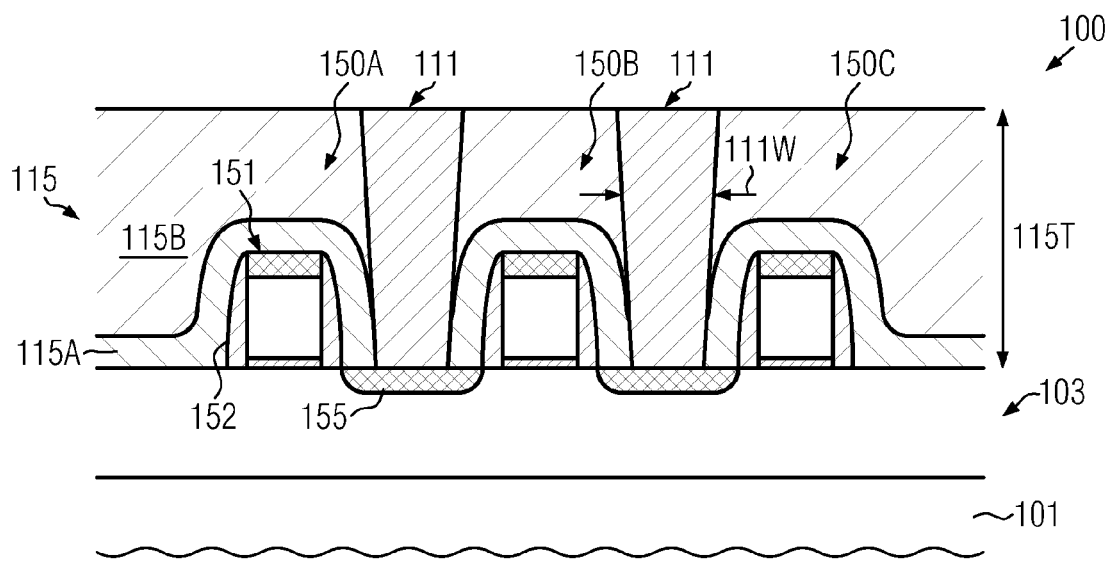
FIG. 1c schematically illustrates a plurality of closely spaced gate electrode structures and contact elements formed therebetween on the basis of a conventional process strategy.

With reference to FIGS. 2a-2e and 3a-3g, further illustrative embodiments will now be described in more detail, wherein reference may also be made to FIGS. 1a-1c, if required.

Figure 2A:
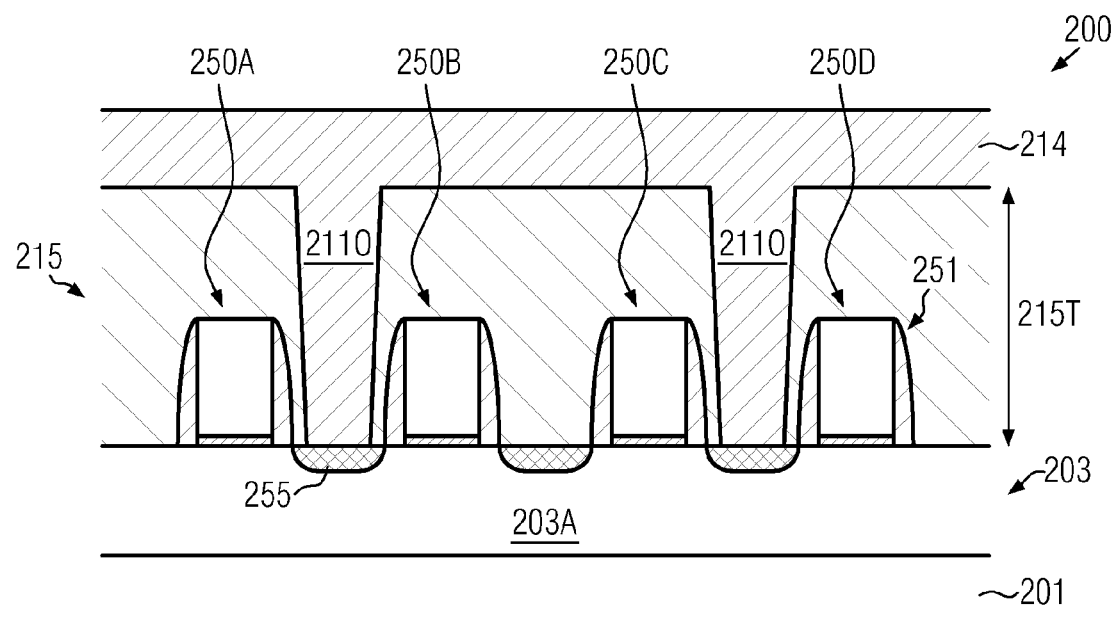
FIGS. 2a-2e schematically illustrate cross-sectional views of a semiconductor device during various manufacturing stages in forming sophisticated contact elements with superior conductivity by using a hybrid configuration with respect to conductive materials, according to illustrative embodiments.

FIG. 2a schematically illustrates a cross-sectional view of a semiconductor device 200 comprising a substrate 201, above which may be formed a semiconductor layer 203. As previously discussed, the semiconductor layer 203 and the substrate 201 may represent an SOI configuration or a bulk configuration, depending on the overall design requirements. Furthermore, the layer 203 may comprise a plurality of active regions (not shown) which may be laterally delineated by any isolation structure (not shown), as is also previously explained with reference to the semiconductor device 100. In the embodiment shown, a plurality of circuit elements 250A, 250B, 250C, 250D may be formed in and above the semiconductor layer 203, i.e., within a corresponding semiconductor region or active region 203A. At least some of these circuit elements 250A, 250B, 250C, 250D may comprise a contact region 255, for instance provided in the form of a metal silicide region and the like. It should be appreciated that the contact regions 255 may represent a portion of drain and source regions, if the circuit elements 250A, 250B, 250C, 250D represent field effect transistors, as is, for instance, also described above with reference to the transistor 150. The contact regions 255 are to be contacted by means of appropriate contact elements, which may thus provide an electrical connection between the contact region 255 and a metallization layer still to be formed above the circuit elements 250A, 250B, 250C, 250D. For example, as illustrated, a dielectric material layer or layer system 215 may be formed above the semiconductor layer 203 and thus above the contact regions 255, wherein the layer 215 or the layer system may comprise respective contact openings 211O having any appropriate lateral dimension in order to meet the design requirements of the device 200. In the embodiment shown, the circuit elements 250A, 250B, 250C, 250D may comprise circuit features, such as gate electrode structures 251, which are formed on the semiconductor region 203A and which may have any appropriate configuration in terms of materials used therein, lateral dimensions and the like. For example, the gate electrode structures 251 may have a configuration as previously discussed with reference to the semiconductor device 100, when referring to the gate electrode structure 151. Depending on the design requirements, the gate electrode structures 251 may have a gate length of 50 nm and significantly less, while also a space between neighboring gate electrode structures 251 may be the same order of magnitude, thereby requiring appropriate lateral dimensions of the contact openings 211 in order to avoid undue exposure of conductive materials of the electrode structures 251, which may otherwise result in pronounced leakage paths or even short circuits. Moreover, as previously discussed, the contact openings 211O may have a depth which may be substantially represented by a thickness 215T of the dielectric layer or layer system 215, which may correspond to the requirements with respect to the parasitic capacitance values, as discussed above. Moreover, as shown, an appropriate conductive material 214 is formed within the contact openings 211O and above the dielectric layer 215. The conductive material 214 may represent any appropriate material or material system, which may provide a specific desired basic conductivity and which may also have material characteristics, which may be compatible with the further processing. That is, the material 214 may provide material characteristics in order to act as a robust interface between the contact regions 255 and a further highly conductive material system to be used during the further processing in providing contact elements of superior conductivity. For example, the conductive material 214 may comprise tungsten, which is a well-established contact metal, as previously discussed. It should be appreciated, however, that the material 214 may also comprise one or more barrier materials, such as titanium, titanium nitride and the like, as, for instance, also described above with reference to the contact elements 111 and 110 of the device 100.

The semiconductor device 200 as illustrated in FIG. 2a may be formed on the basis of similar process techniques as previously described with reference to the semiconductor device 100. For example, after completing the basic structure of the circuit elements 250A, 250B, 250C, 250D including the electrode structures 251, the dielectric material layer 215 or layer system may be formed, for instance by depositing one or more dielectric materials based on any appropriate deposition technique. For example, the material layer 215 may comprise two or more sub-layers, such as a silicon nitride layer in combination with a silicon dioxide layer and the like, as is also discussed above. In other cases, more sophisticated material systems may be applied, for instance in terms of providing highly stressed dielectric materials and the like, depending on the performance requirements of the circuit elements 250A, 250B, 250C, 250D. After the deposition and planarization of the material or material system 215, an appropriate patterning strategy may be applied in order to form the vertical or contact openings 211O with the required lateral dimensions in order to comply with the design requirements, for instance in densely packed device areas including the circuit elements 250A, 250B, 250C, 250D. It should be appreciated that other contact openings may be formed so as to connect to the structures 251 at certain device areas, as is for instance previously described with reference to the semiconductor device 100. Next, any appropriate deposition process may be applied in order to deposit the conductive material or material system 214, wherein, in some illustrative embodiments, well-established CVD-based deposition regimes may be applied in order to provide tungsten in combination with an appropriate barrier material system, as described above. In other illustrative embodiments, the material or material system 214 may be deposited, at least partially, on the basis of other deposition techniques, such as electrochemical deposition processes, wherein, if required, a current distribution layer or a catalyst layer may be deposited, followed by the electrochemical deposition of the actual contact metal. In still other illustrative embodiments, a selective electrochemical deposition process may be applied in which the contact regions 255, possibly in combination with any additional catalyst material, may be used as catalyst for initiating an electrochemical deposition process, wherein an appropriate material may be formed up to a specific height level, which may be less than the height level 215T in order to preserve a portion of the vertical openings 211O, which may be subsequently filled with a conductive material of superior conductivity. For example, in any such embodiments, any appropriate metal material may be deposited, wherein even materials of reduced conductivity may be used, such as cobalt, which may be deposited without requiring any additional barrier materials, thereby in total contributing to superior conductivity in sophisticated applications in which a lateral dimension of approximately 50 nm and less may be required for the contact openings 211O. To this end, any well-established wet chemical deposition recipes may be applied.

Figure 2B:
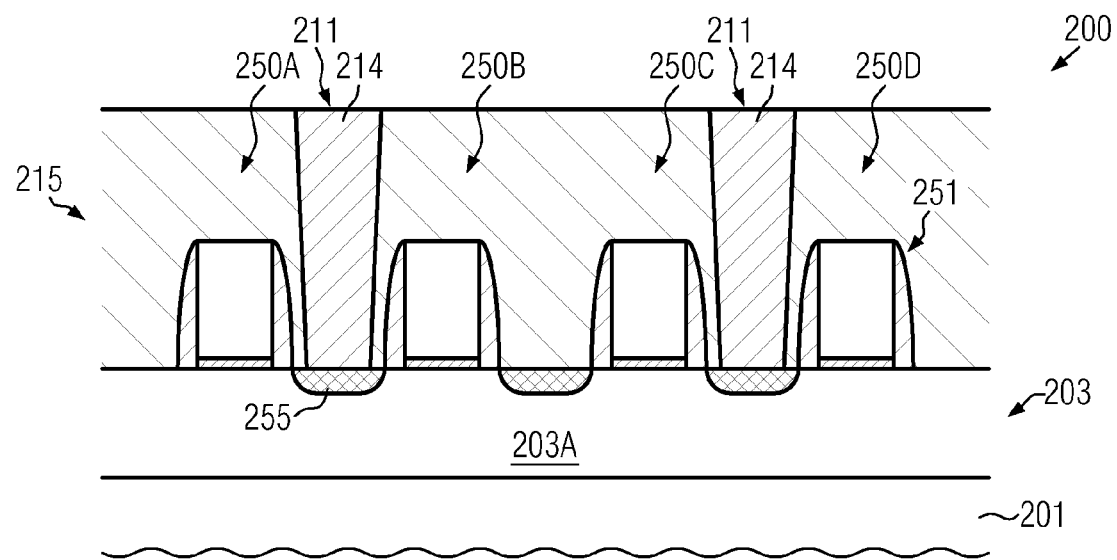

FIG. 2b schematically illustrates the semiconductor device 200 in a further advanced manufacturing stage when starting from the device configuration as shown in FIG. 2a. In this embodiment, any excess portion of the material or material system 214 may be removed, for instance by CMP, etch processes and the like, thereby forming contact elements 211 comprising the conductive material 214. In the embodiment shown, the conductive material 214 extends at least up to the surface of the dielectric layer 215, except for any small recesses (not shown) that may have formed during the removal of any excess portion of the material 214. In other illustrative embodiments (not shown), the contact elements 211 may comprise the conductive material 214 so as to extend up to a certain height level.

Figure 2C:
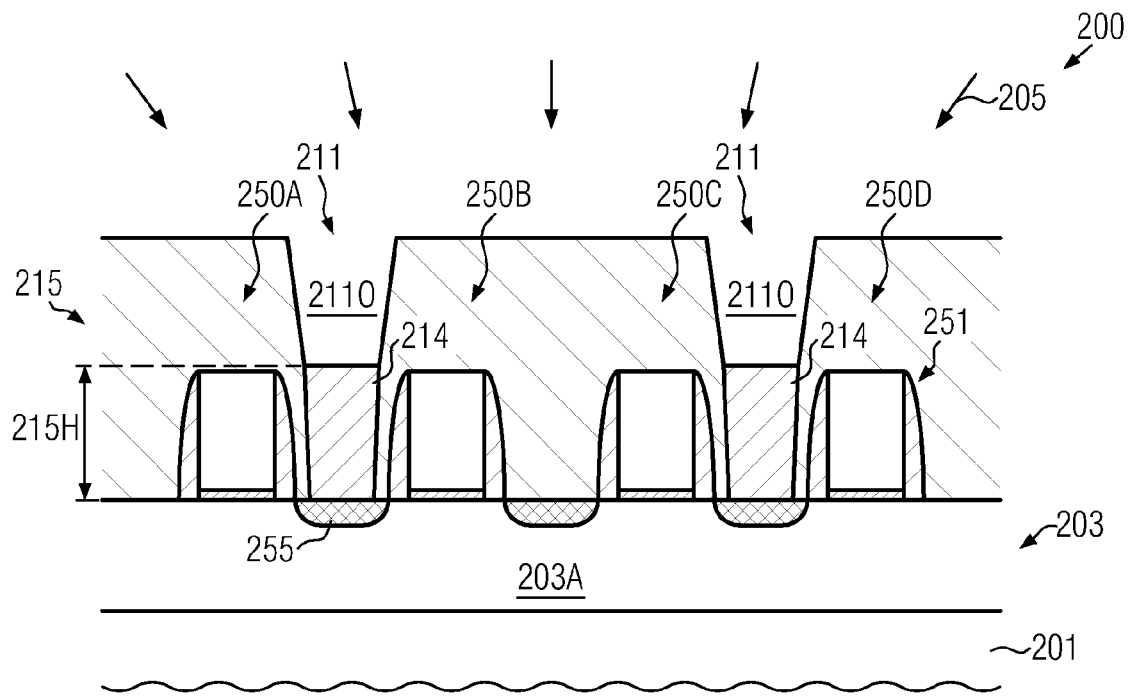

FIG. 2c schematically illustrates the semiconductor device 200 according to illustrative embodiments in which, starting from the device configuration as shown in FIG. 2b, a portion of the conductive material 214 may be removed from the contact elements 211, which may be accomplished on the basis of an etch process 205, which may be a wet chemical etch process and the like. It should be appreciated that a plurality of etch chemistries are well known in the art in order to remove, for instance, tungsten-based material selectively with respect to a barrier material system, such as titanium, titanium nitride, and also selectively with respect to a plurality of dielectric materials, such as silicon dioxide and the like. Consequently, the conductive material 214 extends from the contact region 255 up to a desired height level 215H within the vertical opening 211O, wherein the height level 215H may be appropriately selected so as to comply with the further processing of the device 200 and also comply with requirements for forming other contact elements, for instance contact elements connecting to the gate electrode structures 251. For example, the height level 215H may be equal to or higher than a height level defined by the gate electrode structures 251.

In other illustrative embodiments, the conductive material 214 may be formed, as also described above, within the openings 211O on the basis of a selective electrochemical deposition process so as to extend to the desired height level 215H, wherein a pronounced material deposition on the dielectric material 215 may be avoided.

Figure 2D:
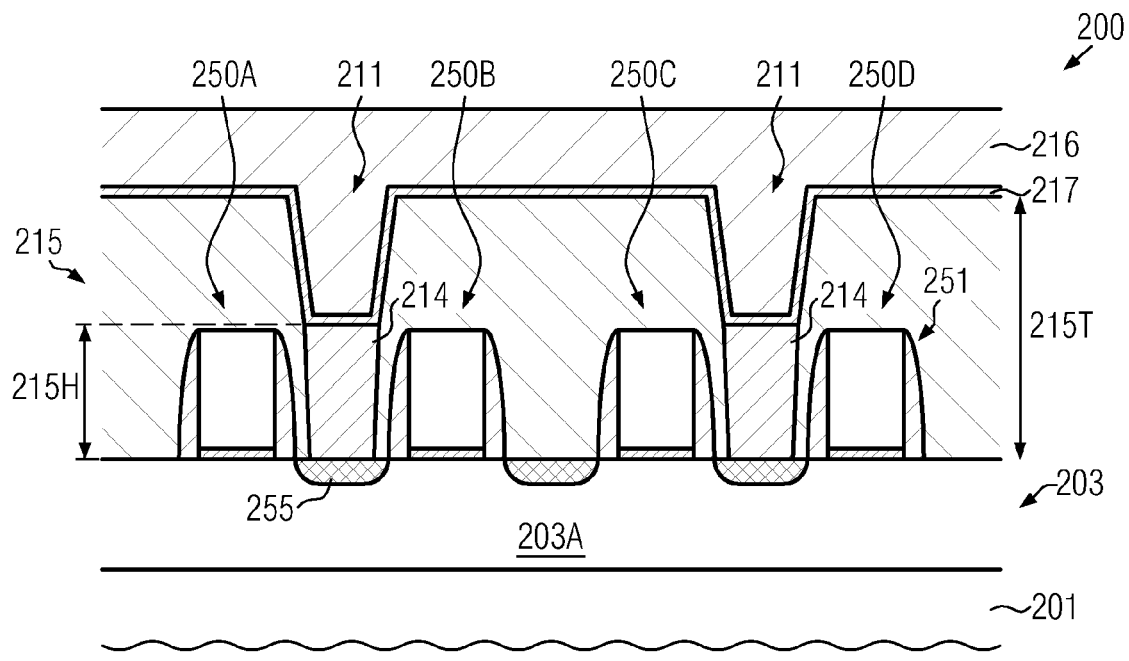

FIG. 2d schematically illustrates the semiconductor device 200 in a further advanced manufacturing stage in which one or more further conductive materials may be provided within the contact opening 211. In the embodiment shown, a conductive material 216 may be provided, for instance, in combination with a barrier material or material system 217, wherein at least the conductive material 216 may have a superior conductivity compared to the material 214. For example, the material 216 may comprise copper, silver and the like, while the barrier system 217 may comprise tantalum, tantalum nitride, titanium, titanium nitride and the like, depending on the overall requirements. The materials 216, 217 may be formed on the basis of any appropriate process technique. For example, the one or more barrier materials 217 may be deposited on the basis of sputter deposition techniques, wherein any pre-deposition sputter etch phase may be applied, since the material 214 may thus provide a robust buffer material with respect to the contact regions 255. It should be appreciated that the height 215H may be selected so that also a portion of the material 214 may still be formed above the gate electrode structures 251, thereby also avoiding undue damage of any lower lying portions of the gate electrode structures 251. It should be appreciated, however, that generally the gate electrode structures 251 may be less critical since typically an increased thickness of a metal silicide may be provided, while also exposure of any semi-conductor material in the structures 251 may be less critical. Thereafter, the one or more materials 217 may be deposited, followed by the deposition of a seed material (not shown), if required, which may then be used for forming the material 216, for instance on the basis of well-established electrochemical deposition techniques.

Figure 2E:
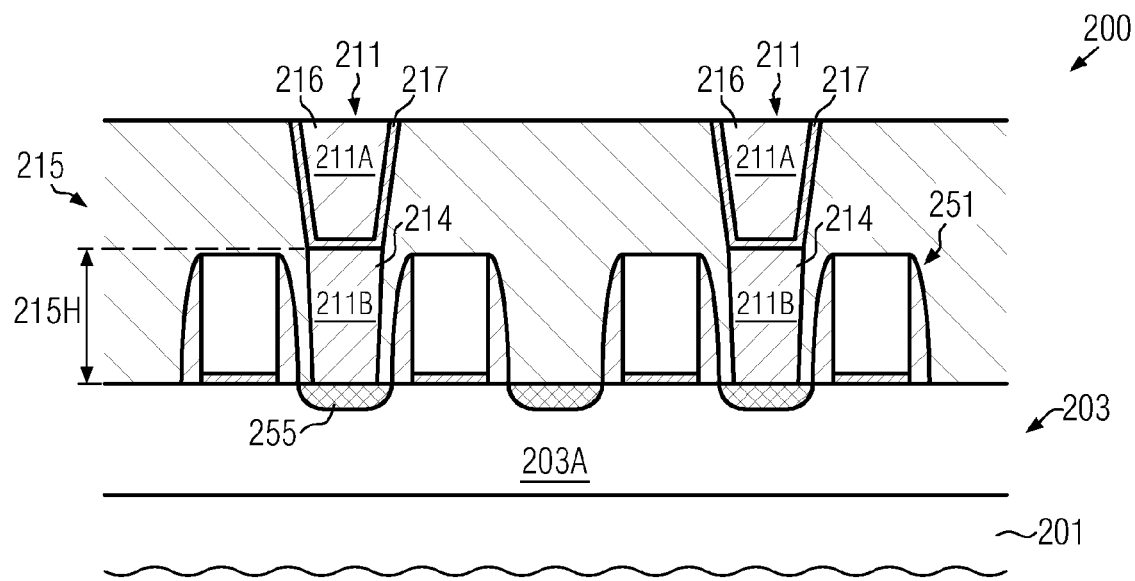

FIG. 2e schematically illustrates the device 200 in a further advanced manufacturing stage. As illustrated, the contact elements 211 may comprise an upper portion 211A substantially extending from the height level 215H to the surface of the dielectric layer 215, while a second portion 211B may extend from the contact region 255 to the height level 215H. The portion 211A may thus comprise the highly conductive material 216 in combination with the barrier material system 217, thereby imparting superior overall conductivity to the contact element 211 compared to a conventional contact element for an otherwise given overall device geometry.

The semiconductor device 200 as shown in FIG. 2e may be obtained on the basis of any appropriate process technique in which any excess portions of the materials 216, 217 may be removed, for instance, by CMP and the like. If required, the material 216 may be passivated by forming an appropriate dielectric cap layer, or any appropriate conductive cap layer may be formed, for instance, by wet chemical deposition techniques and the like. Consequently, the further processing may be continued by forming the very first metallization layer above the dielectric material 215 and the contact elements 211 so as to connect to the contact elements 211, which may then act as hybrid contact elements for connecting the contact regions 255 to the corresponding first metallization layer, as is, for instance, also described above with reference to the semiconductor device 100.

With reference to FIGS. 3a-3g, further illustrative embodiments will now be described in which critical contact openings may be formed so as to extend through a dielectric material or material system in which the very first metallization level is to be implemented.

Figure 3A:
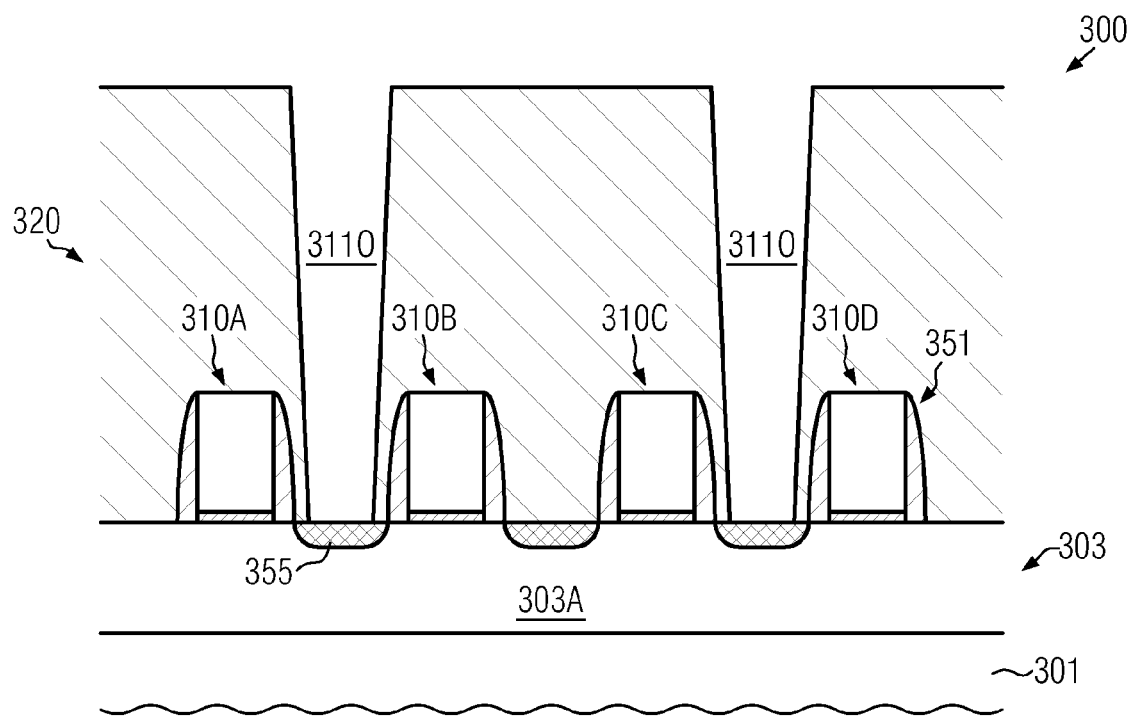
FIGS. 3a-3g schematically illustrate cross-sectional views of a semiconductor device during various manufacturing stages in which vertical contact elements from metal lines of a first metallization layer may be formed so as to directly connect to a contact region of a semi-conductor device by using two different conductive materials in the vertical contact element, according to further illustrative embodiments.

FIG. 3a schematically illustrates a cross-sectional view of a semiconductor device 300, which may comprise a substrate 301, a semiconductor layer 303 and a plurality of contact regions 355 formed so as to be in contact with a semiconductor material of the semiconductor layer 303. Moreover, a plurality of circuit features 310A, 310B, 310C and 310D, such as gate electrode structures 351, may be provided, having any lateral dimensions in accordance with the overall design rules. It should be appreciated that, for any of the components of the device 300 described so far, the same criteria may apply as previously discussed with reference to the semiconductor devices 100 and 200. Furthermore, in the embodiment shown, a dielectric material layer 320, which may also represent a more or less complex layer system, if required, is formed above the semiconductor layer 300 and thus surrounds the gate electrode structures 351. It should be appreciated that the dielectric layer or layer system 320 is appropriately configured so as to comply with requirements for forming an appropriate contact element in combination with a metallization layer of the device 300. For example, the dielectric layer 320 may comprise a low-k dielectric material, which is to be understood as a dielectric material having a dielectric constant of 3.0 and less, as is also discussed above. Moreover, in this manufacturing stage, vertical openings 311O may be formed in the dielectric layer 320 so as to expose at least some of the contact regions 355.

The semiconductor device 300 may be formed on the basis of any appropriate process technique in which, after completing the contact regions 355 and the gate electrode structures 351, one or more appropriate materials may be deposited for forming the layer 320, thereby using any appropriate process strategy. After planarizing the layer 320, sophisticated lithography techniques may be applied, for instance using hard mask materials and the like, in combination with appropriate lithography strategies in order to define the lateral size and position of the openings 311O by an appropriate etch mask. Thereafter, etch processes may be applied so as to form the openings 311O, wherein, depending on the composition of the layer or layer system 320, several different etch chemistries may possibly be applied in order to finally expose the contact region 355. Thereafter, any sacrificial materials, such as hard masks and the like, may be removed by using any appropriate process strategies.

Figure 3B:
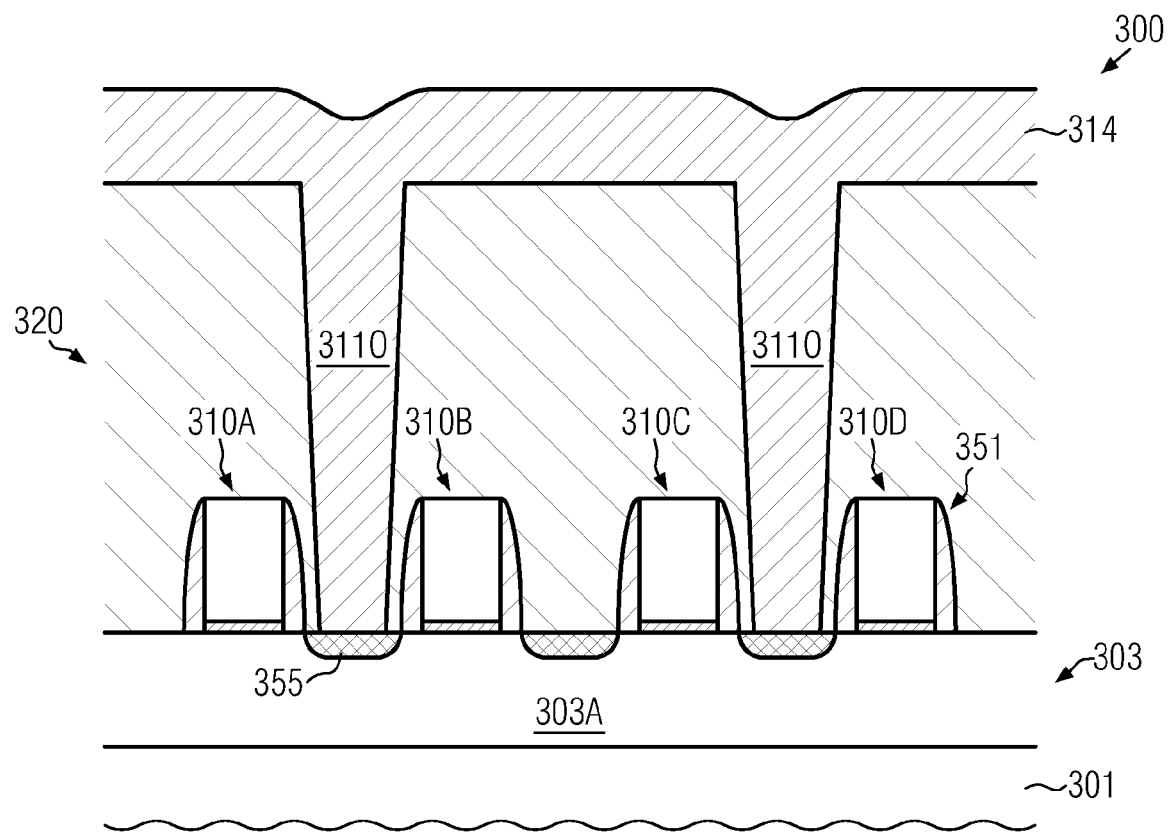

FIG. 3b schematically illustrates the semiconductor device 300 with a conductive material 314 formed at least within the vertical openings 311O. To this end, any appropriate deposition strategy may be applied, for instance CVD-like techniques may be applied for providing tungsten and the like, wherein, as previously discussed, also appropriate barrier materials (not shown) may be deposited.

Figure 3C:
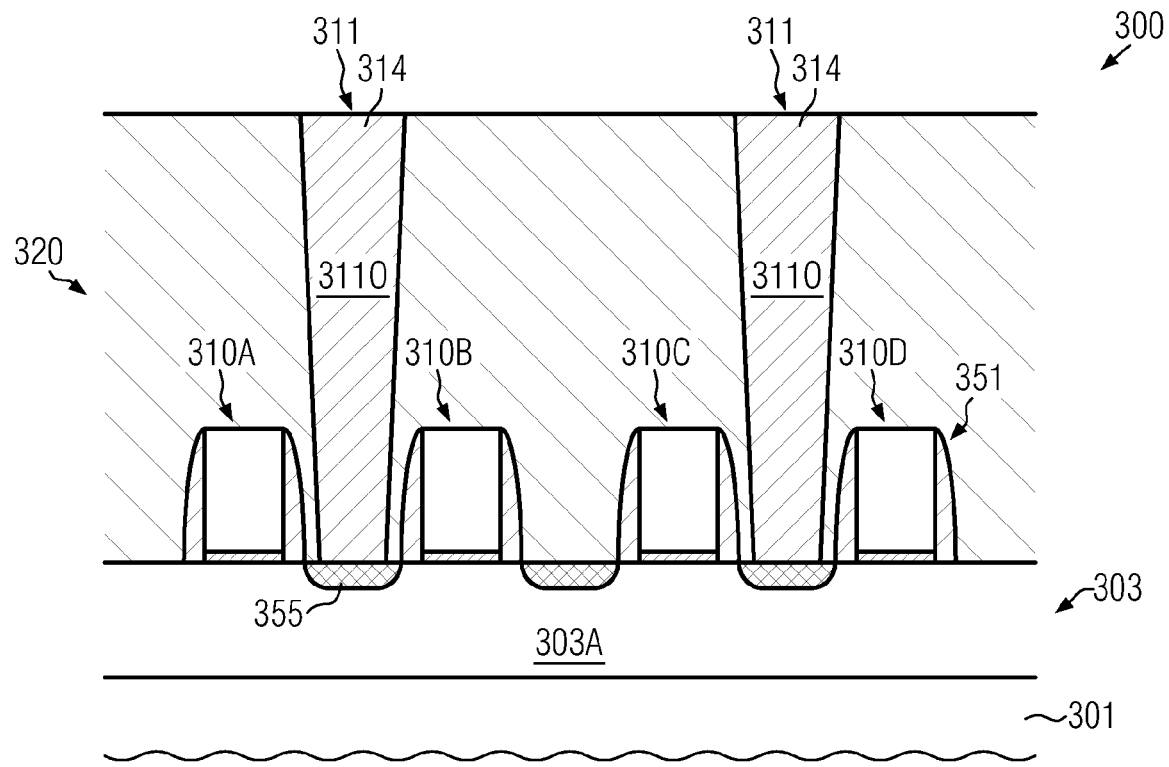

FIG. 3c schematically illustrates the device 300 in a further advanced manufacturing stage in which contact elements 311 are formed in the layer 320 and comprise the conductive material 314, which may thus substantially completely extend through the entire layer 320.

Figure 3D:
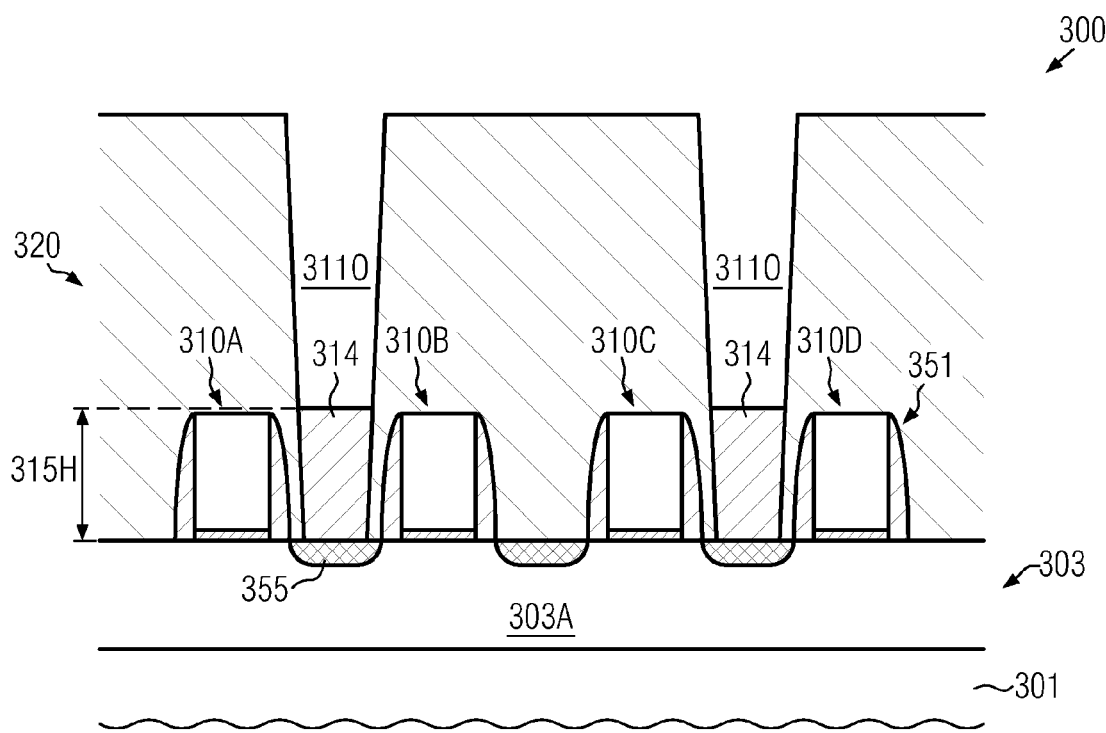

FIG. 3d schematically illustrates the semiconductor device 300 in a further advanced manufacturing stage or according to other illustrative embodiments. As illustrated, the conductive material 314 within the vertical openings 311O may extend from the contact region 355 to a desired height level 315H in accordance with overall requirements, as also described above with reference to the semiconductor device 200. In some illustrative embodiments, the height level 315H of the conductive material 314 may be adjusted on the basis of a material removal process, starting from the device configuration as shown in FIG. 3c. To this end, any appropriate etch recipe may be applied, for instance wet chemical etch processes, in which the material 314, or at least a conductive core metal thereof, may be removed highly selectively with respect to a barrier material or material system (not shown), or selectively with respect to the dielectric layer 320. To this end, as discussed above, a plurality of well-established etch recipes are available. In other illustrative embodiments, the conductive material 314 may be formed, starting from the device configuration as shown in FIG. 3a, by performing a wet chemical deposition process using the contact region 355 as a catalyst material. For example, a plurality of appropriate metals may be deposited on the basis of wet chemical deposition recipes, wherein, in some illustrative embodiments, even specific barrier material systems may be omitted, for instance when depositing cobalt directly on the contact region 355 without providing a barrier material system.

Figure 3E:
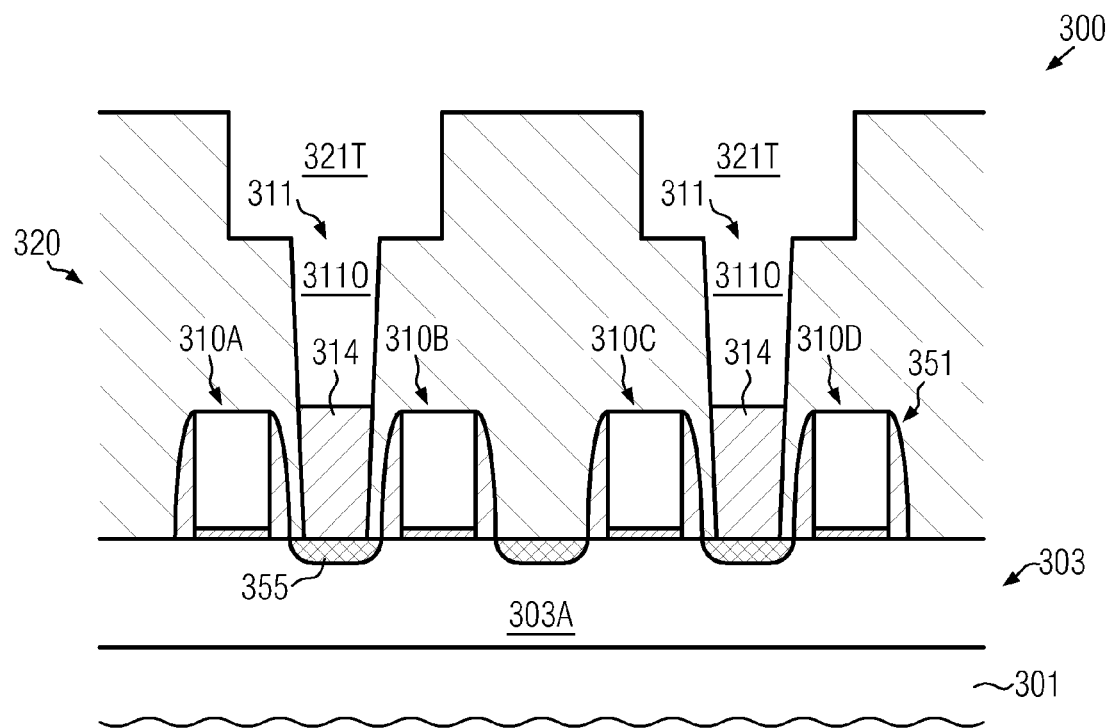

FIG. 3e schematically illustrates the semiconductor device 300 in a further advanced manufacturing stage. As illustrated, trenches 321T are formed in an upper portion of the dielectric layer 320 so as to connect to the vertical openings 311O. To this end, appropriate patterning strategies may be applied, as are also typically used for forming trenches for metal lines of metallization layers. For example, a lithography mask may be applied which defines the lateral position and size of metal lines of the very first metallization layer of the device 300. Thereafter, the lithography mask may be used for patterning a resist material, which may in turn be used for providing a hard mask that in turn is used for patterning the dielectric material 320 on the basis of well-established etch techniques. Thereafter, any hard mask materials and further sacrificial materials, such as planarization materials and the like, may be efficiently removed by using well-established etch processes.

Figure 3F:
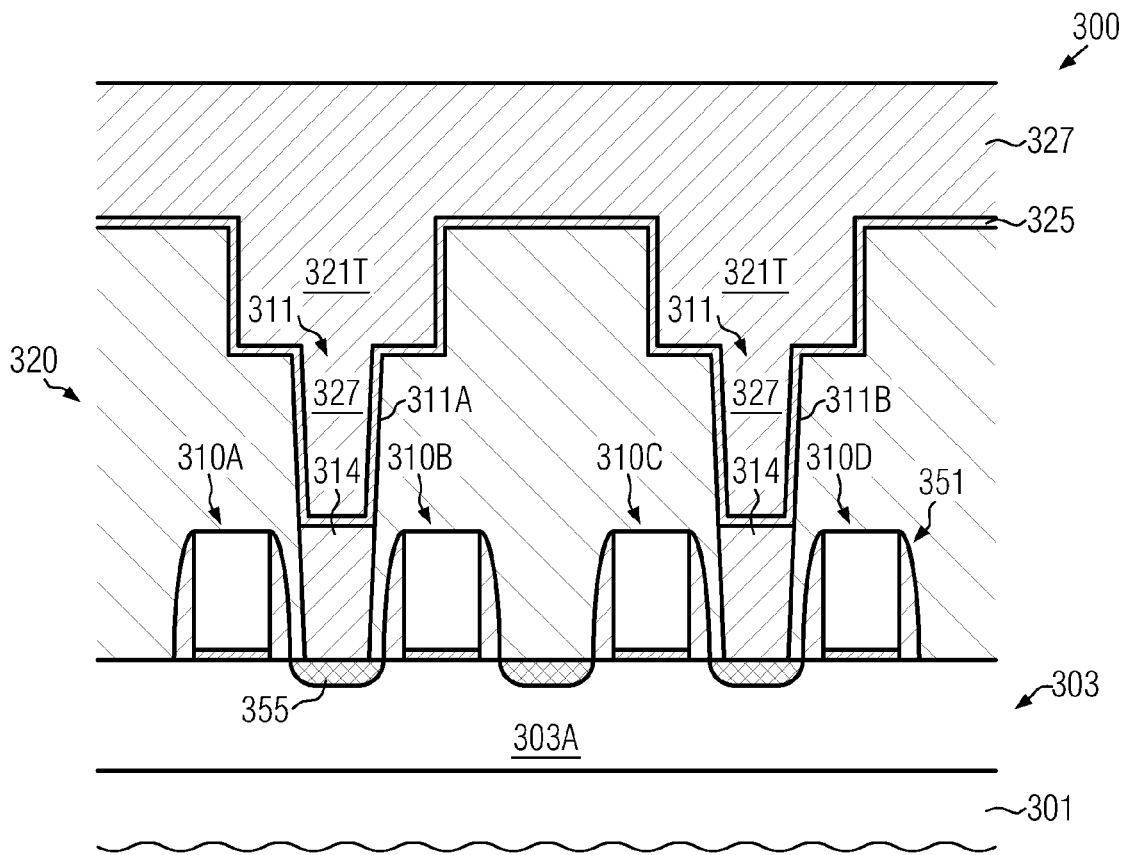

FIG. 3f schematically illustrates the device 300 in a further advanced manufacturing stage in which a barrier material system 325, such as tantalum, tantalum nitride and the like, may be formed on exposed surface areas of the material 320 and on the conductive material 314. Moreover, a highly conductive core metal 327, such as copper, copper alloys, silver and the like, may be formed above the material 320 and within the trenches 321T and the remaining portion of the vertical openings 311O (FIG. 3e), thereby forming a contact element 311 that is a combination of the materials 314 and the material 327 in combination with the barrier material system 325.

A device 300 may be formed on the basis of any well-established process techniques, as are also typically applied in sophisticated metallization systems, for instance when performing a dual damascene strategy. That is, the materials 325 and 327 may be formed in accordance with any desired process sequence, wherein the trench 321T and the remaining portion of the contact element 311 may be filled in a common process sequence. Consequently, the materials 325 may thus continuously extend from an upper portion 311A of the contact element 311 into the trench 321T and also the highly conductive core metal 327 may extend continuously from the upper portion 311A into the trench 321T.

Figure 3G:
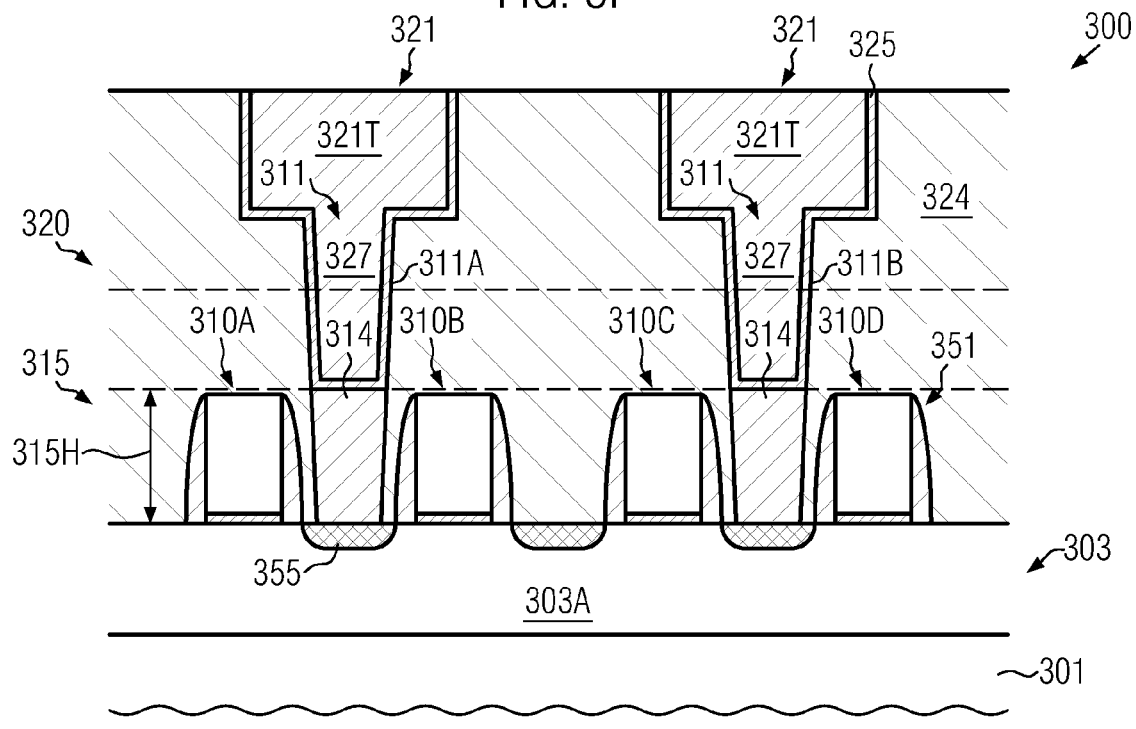

FIG. 3g schematically illustrates the semiconductor device 300 after the removal of any excess material from above the dielectric layer 320. As illustrated, metal lines 321 are formed so as to be in contact with the contact element 311, thereby obtaining a reduced overall contact resistance for connecting the metal lines 321 with the corresponding contact regions 355. That is, due to the hybrid nature of the contact elements 311, superior conductivity may be achieved for connecting the metal lines 321 with the contact regions 355 for a given desired height of the contact element 311 with respect to parasitic capacitance, as is also discussed above. It should be appreciated that the dielectric layer or layer system 320 may thus be provided with a height that is appropriate for accommodating the thickness of the metal lines 321 and provide a desired vertical offset from the gate electrode structures 351. For example, the dielectric layer or layer system 320 may comprise a low-k dielectric material 324, thereby reducing the parasitic capacitance between the closely spaced metal lines 321. Furthermore, the layer system 320 may comprise one or more dielectric layers, such as layers 315, which may be specifically adapted to provide superior passivation of the contact regions 355 and the gate electrode structures 351. For example, the layer or layers 315 may have a similar configuration as previously described with reference to the semiconductor devices 100 and 200. Moreover, a certain height level 315H may be selected for filling the contact elements 311 with the conductive material 314 of inferior conductivity, however, with superior interface characteristics in terms of copper confinement, sputter etch robustness and the like.

As a consequence, the present disclosure provides semiconductor devices and manufacturing techniques in which a hybrid vertical contact element may be provided so as to ensure integrity of sensitive semiconductor-based device areas, for instance in view of copper incorporation and the like, while at the same time superior overall conductivity may be obtained for a given height of the contact elements by providing a material of superior conductivity, such as copper, silver and the like. In this manner, reduced contact resistance values may be obtained without having to increase the lateral dimensions of the contact elements, while a desired vertical offset of the metallization layer with respect to critical device areas may be preserved in order to reduce parasitic capacitance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a dielectric layer above a circuit element having a contact region formed in a semiconductor region;
   forming a contact opening in said dielectric layer, said contact opening exposing said contact region;
   filling said contact opening with a first conductive material;
   forming a contact element comprising said first conductive material in said dielectric layer by performing a chemical mechanical planarization process to remove excess portions of said first conductive material that are formed outside of said contact opening and above said dielectric layer, wherein said contact element connects to said contact region and completely fills said contact opening;
   forming a recess in said contact element by removing a portion of said first conductive material;
   after forming said recess, forming a trench in said dielectric layer that connects to said recess and has a depth that is less than a depth of said recess; and
   filling said recess and said trench with a second conductive material, said second conductive material differing from said first conductive material.

2. The method of claim 1, wherein filling said recess in said contact element and said trench with said second conductive material comprises depositing at least one of a copper-containing material and a silver-containing material.

3. The method of claim 1, wherein said first conductive material comprises tungsten.

4. The method of claim 1, wherein said first conductive material comprises cobalt.

5. The method of claim 1, wherein filling said contact opening with said first conductive material comprises performing an electrochemical deposition process.

6. The method of claim 1, wherein filling said recess in said contact element and said trench with said second conductive material comprises depositing said second conductive material in said recess and said trench during a common deposition process.

7. The method of claim 1, wherein forming said dielectric layer comprises forming at least a portion of said dielectric layer by providing a low-k dielectric material.

8. The method of claim 1, wherein, after performing said chemical mechanical planarization process, a planarized upper surface of said contact element is substantially flush with a planarized upper surface of said dielectric layer.

9. The method of claim 1, further comprising forming a barrier material at least on exposed sidewall and bottom surfaces of said recess prior to filling said recess with said second conductive material.

10. A method of forming a hybrid contact element, the method comprising:
   forming a dielectric layer above a circuit element, said circuit element having a contact region;
   forming a substantially vertical opening in said dielectric layer so as to expose said contact region;
   forming a first conductive material above said contact region so as to at least completely fill said substantially vertical opening;
   performing a chemical mechanical planarization process to remove excess portions of said first conductive material formed outside of said substantially vertical opening and above said dielectric layer;
   forming a first portion of said hybrid contact element by removing an upper portion of said first conductive material from an upper portion of said substantially vertical opening while leaving a lower portion of said first conductive material in a lower portion of said substantially vertical opening, said lower portion comprising said first portion of said hybrid contact element;
   after forming said first portion of said hybrid contact element, forming a trench in said dielectric layer so as to connect to said upper portion of said substantially vertical opening, wherein a height level of an upper surface of said first portion above said contact region is less than a height level of a bottom surface of said trench; and
   forming a second portion of said hybrid contact element connecting to said first portion of said hybrid contact element by filling a second conductive material into said trench and said upper portion of said substantially vertical opening, a conductivity of said second conductive material being higher than a conductivity of said first conductive material.

11. The method of claim 10, wherein said first conductive material comprises at least one of tungsten and cobalt.

12. The method of claim 10, wherein said second conductive material comprises at least one of copper and silver.

13. The method of claim 10, wherein forming said dielectric layer comprises forming said dielectric layer so as to comprise a low-k dielectric material.

14. The method of claim 10, wherein, after performing said chemical mechanical planarization process, a planarized upper surface of said first conductive material filling said substantially vertical opening is substantially flush with a planarized upper surface of said dielectric layer.

15. The method of claim 10, wherein forming said second portion of said hybrid contact element comprises forming a barrier material on exposed sidewall and bottom surfaces of said trench and said upper portion of said substantially vertical opening.

\* \* \* \* \*